United States Patent [19]

Greer et al.

[11] 3,881,971

[45] May 6, 1975

[54] METHOD FOR FABRICATING ALUMINUM INTERCONNECTION METALLURGY SYSTEM FOR SILICON DEVICES

[75] Inventors: Stuart E. Greer, Poughkeepsie; Randolph H. Schnitzel, Newburgh; David P. Waldman, Poughkeepsie, all of N.Y.

[73] Assignee: International Business Machines Corporation, Armonk, N.Y.

[22] Filed: Nov. 29, 1972

[21] Appl. No.: 310,318

[52] U.S. Cl. .................... 156/11; 117/217; 156/17; 357/71

[51] Int. Cl. .................... C23b 3/04; C23f 1/02

[58] Field of Search .................... 156/3, 7, 8, 11, 17, 22; 29/518; 317/234 M; 357/71; 117/217

[56] References Cited

UNITED STATES PATENTS

| | | | |
|---|---|---|---|
| 2,778,790 | 1/1957 | Sobol | 204/58 |
| 3,382,568 | 5/1968 | Kuiper | 29/578 |
| 3,751,292 | 8/1973 | Kongable | 117/212 |

*Primary Examiner*—William A. Powell
*Assistant Examiner*—Brian J. Leitten
*Attorney, Agent, or Firm*—Wolmar J. Stoffel

[57] ABSTRACT

A method of fabricating an improved aluminum metallurgy system of conductive stripes on a monocrystalline silicon semiconductor device that makes electrical contact with the body of the device through at least one opening in an insulating layer, wherein there is formed a blanket layer of aluminum over the insulating layer which makes contact through the monocrystalline body of silicon through at least one opening, a thin blanket layer of silicon is deposited over the layer of aluminum, selected portions of the aluminum and silicon layers are removed to define an interconnection metallurgy system, and a passivating layer of insulating material is formed over the metallurgy system. The resultant semiconductor device is capable of withstanding heat for prolonged periods of time at temperatures of up to 577° C without undergoing significant aluminum penetration into the silicon body since the silicon on the overlying layer satisfies the silicon solubility requirements of the aluminum.

8 Claims, 9 Drawing Figures

PRIOR ART

METHOD FOR FABRICATING ALUMINUM INTERCONNECTION METALLURGY SYSTEM FOR SILICON DEVICES

DESCRIPTION OF THE PRIOR ART

This invention relates to integrated circuit device structure and methods for fabricating, and more particularly, to an improved aluminum metallurgy system that will withstand process heat treatments without significant device degradation, and methods for fabricating the metallurgy systems.

Aluminum is widely recognized as a useful metal for a conductive metallurgy system for a semiconductor device. The metallurgy system connnects the various individual active and passive semiconductor elements of a device into an operative circuit relationship. Aluminum has a fairly high conductivity, adheres well to glass and other passivating layers, is relatively easy to deposit and etch, and makes a direct ohmic contact with silicon semiconductor material.

Aluminum does, however, have the disadvantage that it alloys with silicon at temperatures above 577° C by the formation of a liquid phase. Below 577° C, the aluminum participates in a solid state diffusion reaction with silicon in which silicon diffuses into aluminum preferentially. The resultant effect is that the original interface between the two materials moves in the direction of the silicon. This means that aluminum, either pure aluminum or aluminum alloyed with small amounts of other metals will, when heated, penetrate or sink into the silicon to satisfy the solid solubility. This diffusion effect can result in penetration of the stripe contact into the silicon body to a sufficient extent to cause a "shorting" of diffused silicon regions and also cause movement in the aluminum stripe in some instances causing a constriction in the metal at the oxide step. A constriction or reduction in section area makes the stripe more prone to failure by electromigration since the current density is higher locally and the stripe at the point of the constriction will therefore operate at a higher temperature due to Joule heating. Diffusion of the aluminum and silicon is a significant problem since modern microminiaturized semiconductor devices are normally subjected to a number of heating steps after the metallurgy system is fabricated. These fabrication steps, typically for making low resistance ohmic contacts or for applications of insulating and passivating layers or for additional metallurgy layers, normally require that the device be subjected to additional heat steps.

Commonly assigned U.S. Pat. No. 3,382,568 discloses a number of solutions for the aforementioned problem. This disclosure presents additional techniques and structural refinements that advance the state of the art. One technique suggested in the aforementioned patent is the use of an aluminum-silicon alloy as the stripe metal. This satisfies the solubility requirement of aluminum for silicon and prevents aluminum penetration of the silicon body. However, in certain applications, its use is limited because after etching the aluminum film to fabricate the metallurgy stripes, a thin film of silicon remains on the oxide which is difficult to completely remove. Another suggested technique is to provide, after contact holes have been opened, a thin layer of pure aluminum, a thin overlying layer of silicon, and a relatively thick overlying layer of aluminum. This technique may have limitations in certain applications because the silicon layer must be very thin or it would otherwise introduce objectionable additional resistance. Also, it must be sufficiently thin to be permeable to the aluminum etchant so that the underlying layer of aluminum can be removed. This requirement for an extremely thin silicon intermediate layer can cause fabrication difficulties and present the situation where insufficient silicon is available to satisfy the solubility requirement of the aluminum, particularly if prolonged or numerous heatings of the device occurs. It also has the problem of removing excess silicon from the oxide.

Another solution to the aforementioned problem is suggested in commonly assigned U.S. Pat. application Ser. No. 188,921 filed Oct. 13, 1971, now abandoned. In this application, there is suggested providing a thin layer of silicon on the underside of the metallurgy stripe at least adjacent the contact holes which, when the device is heated, would satisfy the silicon requirement. The structure is fabricated by depositing a blanket layer of silicon over an insulating layer provided with contact or via holes, depositing a blanket layer of aluminum over the silicon layer, and subsequently removing selected portions of the aluminum and silicon layers to define the interconnection metallurgy system desired. A disadvantage in this structure is that a high resistance layer of silicon is deposited in the contact openings which under certain circumstances alters the nature of the silicon metal contact interface. Further, in the selective removal of the aluminum and silicon layer, it was usually necessary to use two different types of etchants: one for silicon, and one for aluminum.

SUMMARY OF THE INVENTION

It is an object of the present invention to provide an improved aluminum metallurgy interconnection stripe system which can be heated without significantly degrading the device or the metallurgy system.

Another object of this invention is to provide a method for fabricating an improved aluminum metallurgy system which will withstand exposure to heating cycles without degrading the device.

Another object of this invention is to provide an improved aluminum interconnection metallurgy system wherein the solid solubility requirements of the aluminum for silicon at the contact opening is satisfied by silicon material other than that of the semiconductor body.

In accordance with the aforementioned objects, the improved aluminum interconnection metallurgy system of the invention for use on a monocrystalline semiconductor body having a passivating layer of insulating material with contact openings therein, comprises a layer of aluminum or an alloy of aluminum, and a thin overlying layer of silicon. The thin layer of silicon is provided so that upon heating the stripe, sufficient silicon is present to satisfy the solubility of silicon in aluminum. This effectively minimizes or eliminates the alloying of the silicon in the contact openings which might otherwise cause penetration by the aluminum into the body of the device or a thinning down of a cross-section of the stripe adjacent the opening.

The method of fabricating an improved aluminum interconnection metallurgy system of stripes on a monocrystalline silicon device involves depositing a layer of aluminum over a passivating layer on the device provided with suitable contact openings, depositing a thin layer of silicon on the top of the aluminum layer, selectively removing portions of the composite aluminum-silicon layer to define the desired interconnection metallurgy system, and subsequently depositing a layer of insulating material over the metallurgy system for passivation purposes. The foregoing steps can be repeated when a multi-level interconnection metallurgy system is desired.

BRIEF DESCRIPTION OF THE DRAWINGS

The foregoing and other features and advantages of the invention will be apparent from the following more particular description of preferred embodiments of the invention as illustrated in the accompanying drawings.

DESCRIPTION OF THE PREFERRED EMBODIMENTS

Figure 1:
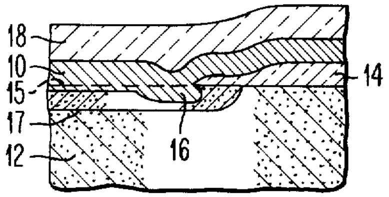
FIG. 1 is a sectional elevational view of a semiconductor device through an aluminum stripe which illustrates the difficulties attendant in producing a pure aluminum ohmic contact therein when subsequent heat treatments in the approximate range of 350°–577° C are used.

Referring now to FIG. 1 of the drawing, there is depicted a cross-sectional view illustrating a problem prevalent in the use of aluminum metallurgy on a silicon substrate in a microminiaturized integrated circuit device. As is well known in the art and evident in an aluminum-silicon solubility phase diagram, aluminum annd silicon forms solid solution alloys at the aluminum rich edge of the diagram. Consequently, when a pure aluminum layer 10 or aluminum alloy layer is placed in direct contact with a silicon substrate 12 through an opening in an insulating layer 14 and the device heated, the aluminum stripe alloys with the silicon of substrate 12. Actually, silicon diffuses into the aluminum by solid state diffusion and the original interface moves in the direction of the silicon. This results in a measurable amount of penetration of the aluminum into the silicon in substrate 12. The silicon source for the aluminum over oxide can only be derived from the silicon substrate at the near end of the contact hole. During heat treatment, the volume of the aluminum stripe directly above the contact hole removes only a small layer of the silicon as indicated by the dotted line 15 which represents the original top surface of substrate 12.

This very thin layer of removed silicon which combines with the aluminum is usually acceptable. However, as the device is further heated, the silicon diffuses longitudinally along the stripe in order to satisfy the silicon requirements of the stripe adjacent to the step-down over insulation 14. In this region, the aluminum layer 10 is isolated from the silicon in substrate 12. Thus, the greater total demand for silicon in the region of stripe 10 adjacent to the step-down results in a relatively deep penetration 16 of the silicon. A deep penetration that reaches the PN junction 17 will effectively short-out the device. In modern microminiaturized semiconductor devices, the diffused emitter region is relatively thin, occasionally on the order of 15 to 30 micro-inches, which can very easily be reached by the penetration resulting from the aluminum silicon alloying. The heating following the deposition of stripe 10 is necessary to make a low resistance ohmic contact to the silicon body 12. Some heating also occurs during depositing passivating layer 18, and also during the depositing and fabricating of additional metallurgy layers and terminals, packaging, etc. This problem has been recognized in the prior art, and particularly in U.S. Pat. Nol 3,382,568 and various techniques suggested. As discussed previously, the suggestions for preventing alloying of aluminum and silicon cannot always be universally employed for the reasons discussed.

Figure 2:
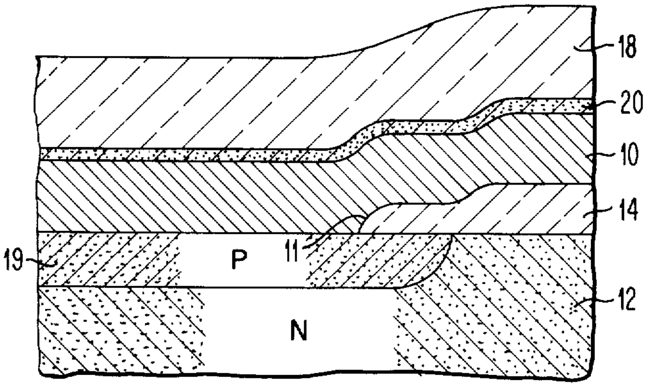
FIG. 2 is a sectional view in greatly enlarged scale of a cross-section of a semiconductor device illustrating one embodiment of the invention.

In FIG. 2, there is illustrated a preferred specific embodiment of the invention which prevents the deep penetration of aluminum into the silicon body due to the alloying of the stripe which was illustrated and discussed in relation to FIG. 1. In FIG. 2, substrate 12 has an opening 11 for making contact to a diffused region 19. A thin polycrystalline silicon layer 20 overlies completely the aluminum or aluminum alloy stripe 10. A layer of glass 18 is deposited over the surface of the device and protects it from contamination, the atmosphere, etc. In FIG. 2, only a single interconnection metallurgy layer is depicted. However, it is understood that additional metallurgy layers can be utilized which are typically separated by insulating layers of $SiO_2$, glass, or the like. The deep penetration of the substrate 12 by the aluminum stripe adjacent the step-down or edge of the opening 11 is prevented by silicon layer 20. Layer 20 being in close proximity to aluminum layer 10, provides sufficient silicon to satisfy the solubility requirements of the aluminum stripe that is isolated from the silicon substrate 12. The optimum thickness for silicon layer 20 is determined by the thickness of aluminum stripe 10. In general, the weight percent of the silicon layer 20 is as a minimum of 1.65% in the aluminum layer 10 when heat treatments approach the critical temperature. Less than 1.65% silicon is permissible if the time-temperature combination demands less than equilibrium composition. In general, the thickness of the layer will be in the range of 30 to 500 Angs. for device metallurgy stripes commonly used in integrated circuit devices wherein the aluminum layer has a thickness in the range of one to two micrometers. Preferably, the ratio of the thickness of the aluminum film to the thickness of the overlying silicon layer will be in the range of 50 to 120.

Figure 3:
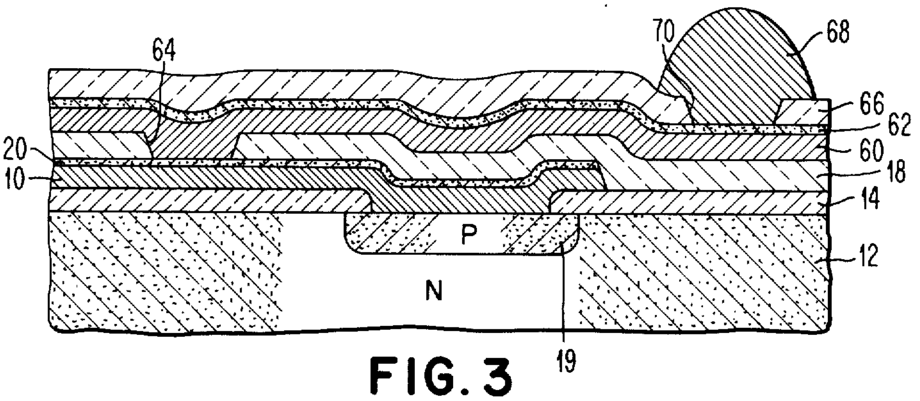
FIG. 3 is a sectional view of a cross-section of a semiconductor device illustrating the application of the invention to a multi-level interconnection metallurgy system.

In FIG. 3 is illustrated a device having a multi-level interconnection metallurgy system utilizing the concept of the invention namely, providing a silicon layer on the top surface of an aluminum metallurgy stripe. The semiconductor body 12 and lower stripe 10 is basically similar to that illustrated in FIG. 2. However, there is additionally provided a second aluminum interconnection metallurgy stripe 60 having a thin silicon layer 62 that makes contact to the underlying metallurgy stripe 10 through opening 64 in glass layer 18. An insulating layer 66 is provided over the metallurgy layer 60 and an electrical terminal 68 makes contact with the metallurgy layer 60 through opening 70.

Figure 7A:
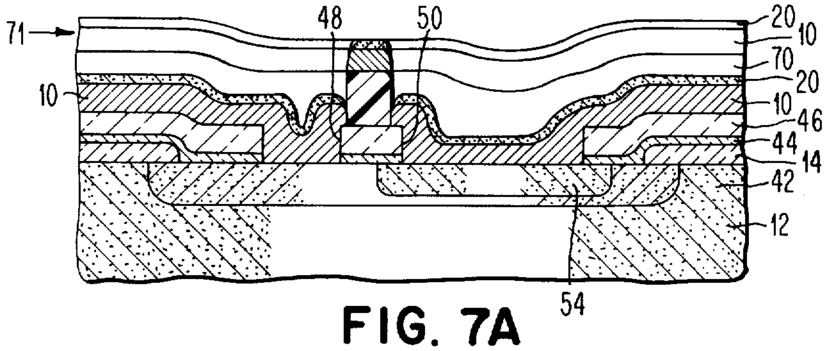
FIG. 7A is a sectional view illustrating a modification of the process illustrated in FIGS. 4–8.
Figure 4:
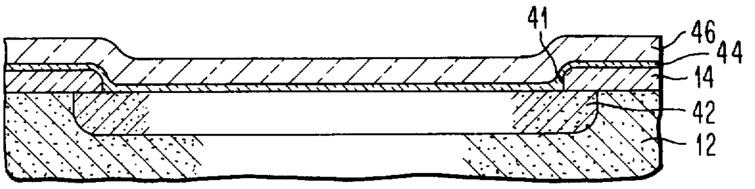
FIGS. 4–8 are a sequence of elevational views in broken section illustrating the steps of the method of the invention for fabricating improved aluminum metallurgy systems of conductive stripes of the invention.
Figure 5:
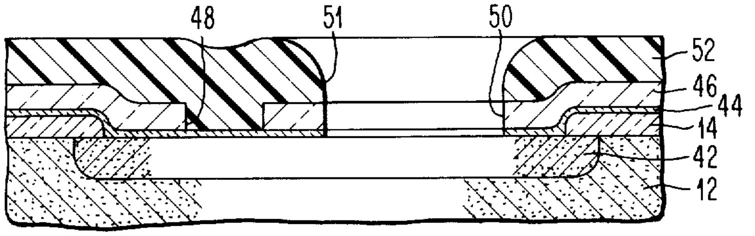
Figure 6:
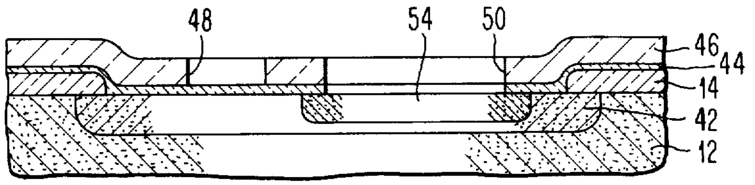
Figure 7:
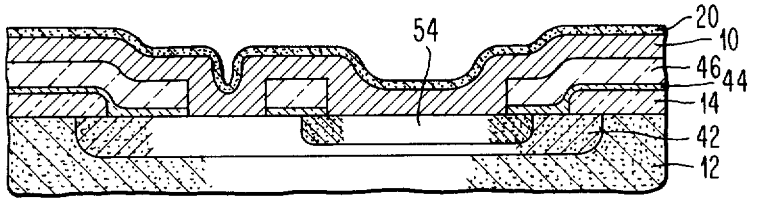
Figure 8:
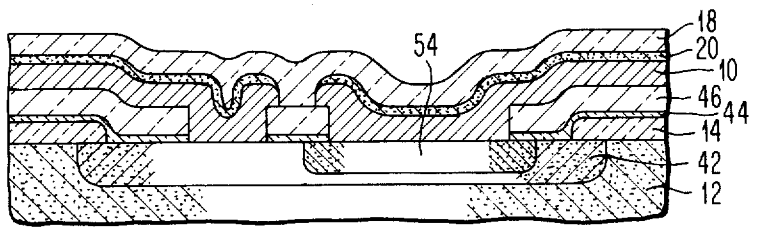

FIGS. 4–8 depict a sequence of steps for fabricating the metallurgy system of the invention. Referring now to FIG. 4, a layer 14 of $SiO_2$ is formed on substrate 12, typically by thermal oxidation, and an opening 41 made in layer 14 using conventional photolithographic techniques and differential etching. Opening 41 serves as a diffusion window for selectively introducing an impurity into the substrate 12 resulting in a diffused region 42. Subsequently, an additional thin layer 44 of $SiO_2$ is formed, preferably by thermal oxidation. A layer 46 of $Si_3N_4$ is then deposited over layer 44. Layer 46 can be formed by chemical vapor deposition typically exposing the heated wafer to a stream of silane and ammonia in a suitable chamber. It is understood that any suitable dielectric layer can be used. Openings 48 and 50 are formed in layer 46 by suitable conventional photolithographic techniques and differential etching. A photoresist layer 52, as shown in FIG. 5, is deposited, exposed and developed to form opening 51. The thin portion of layer 44 in opening 50 can be removed, and resist layer 52 removed. After the photoresist layer 52 is removed, the device is exposed to a suitable source of impurity ions which results in a diffused emitter region 54. Preferably, all of the openings in $Si_3N_4$ layer 46 are formed with a single mask which eliminates registration problems as when separate masks are used for separate sets of openings. A second photoresist layer (not illustrated) having an opening 51 located over opening 48 in layer 46 is used to remove the thin $SiO_2$ layer 44 in the bottom of opening 48 by a dip etching. A blanket layer of aluminum 10 is then deposited on the surface of layer 46 and a thin layer of silicon 20 deposited on the top, as shown in FIG. 7. The desired interconnection metallurgy configuration can then be formed using conventional photolithographic techniques where a layer of photoresist is deposited on the surface of the blanket layers, exposed and developed, to form the desired pattern. The exposed silicon and aluminum layers can then be subtractively etched. If the thickness of silicon layer 20 is less than 200 Angs., a conventional aluminum etch can be used to remove both the silicon and aluminum. If silicon layer 20 is greater than 200 Angs., a silicon etch is used to remove the silicon followed by an aluminum etch to remove the aluminum. A typical silicon etch can be an aqueous solution which contains hydrofluoric acid. A typical aluminum etch consists of 32 milliliters of $H_3PO_4$, 200 milliliters of 69–70% $HnO_3$, 600 milliliters of D.I.$H_2O$, and 13 milliliters of surfactant. If desired, additional metallurgy levels can be built up to form the desired metallurgy system, as shown in FIG. 3.

An alternative method for forming the desired interconnection metallurgy system is shown in FIG. 7A. In this preferred specific embodiment, a resist layer 70 is deposited on the surface of the silicon nitride layer 46. A reverse pattern on the desired interconnection metallurgy system is formed in the resist using standard photolithographic techniques. Blanket layers of aluminum 10 and silicon 20 are then deposited by suitable techniques, as for example, be evaporation, on the surface of the device resulting in portions 71 that rest on the top surface of photoresist layer 70 and other portions that are in contact with layer 46 and the exposed monocrystalline body through openings 50 and 48. Contacting the resultant device with a solvent for the resist removes the resist and all of the overlying portions of aluminum and silicon layers 10 and 20, respectively. Additional layers of metallurgy separated by dielectric layers can be formed using the same technique.

The method and structure of the invention is also applicable to metallurgies formed by anodization techniques, as for example, the techniques described and claimed in commonly assigned patent application Ser. No. 239,082 filed Mar. 29, 1972, now U.S. Pat. No. 3,827,949 and entitled "Anodic Oxide Passivated Planar Aluminum Metallurgy System and Method of Producing." In such a process, a blanket layer of aluminum or aluminum alloy is deposited over an insulating layer on a silicon semiconductor. The aluminum layer makes contact to the silicon semiconductor body through openings in the insulating layer. A thin blanket layer of silicon is deposited over the aluminum layer, and the desired metallurgy pattern delineated by a suitable mask. The silicon is removed in the exposed areas with a suitable etchant, and the resultant exposed aluminum anodized to convert it to aluminum oxide. The structure is covered by a layer of insulation, and/or additional layers of metallurgy. The silicon overlay functions in the same manner previously described relative to the other preferred embodiments.

The method as disclosed has several advantages not present in prior art techniques for forming aluminum interconnection metallurgy systems. A very significant advantage is that the silicon layer 20 on the top surface of the aluminum metallurgy stripe 10 serves as a via hole etchant stop during etching of via holes in the overlying passivating layer. This prevents degradation to the underlying stripe by the etchant used to form the via holes. Another significant advantage is that the aluminum in the via holes is covered with a thin silicon layer which prevents the formation of $Al_2O_3$ on the surface of the stripe which would occur in conventional techniques. The silicon serves as a protective layer preventing oxidation. Still another advantage is that the silicon layer reduces the reflectivity of the aluminum which is important in forming accurate photoresist layers used to mask the interconnection pattern.

While the invention has been particularly shown and described with reference to preferred embodiments thereof, it will be understood by those skilled in the art that various changes in form and detail may be made therein without departing from the spirit and scope of the invention.

We claim:

1. A method of fabricating an improved aluminum metallurgy system of conductive stripes on a monocrystalline silicon semiconductor device that makes electrical contact with the body of the device through at least one opening in an insulating layer comprising:

forming a blanket layer of aluminum over said insulating layer which makes contact with the monocrystalline body of the silicon device through at least one of said openings, depositing a thin blanket layer of silicon over said layer of aluminum, the thickness of said layer of silicon being such that the ratio of the thickness of said aluminum layer to the thickness of said silicon layer is in the range of 50 to 1 to 120 to 1, removing selected portions of said aluminum and silicon layers to define an interconnection metallurgy system, forming a passivating layer of insulating material over said metallurgy system in direct contact with said layer of silicon, and said semiconductor device capable of withstanding heating for prolonged periods at temperatures up to 577° C without undergoing significant aluminum penetration into the silicon body.

2. The method of claim 1 wherein said blanket layer is an alloy of aluminum which includes copper in an amount in the range of 2–20% by weight.

3. The method of claim 1 which further includes forming openings in said passivating layer of insulating material overlying said metallurgy system, depositing a second blanket layer of aluminum, depositing a second thin layer of silicon, and removing selected portions of said second silicon and said second aluminum layers to define a second interconnection metallurgy level.

4. The method of claim 1 wherein said silicon layer has a thickness less than 200 Angs., the selected portions of said aluminum and silicon layers are both removed by selective etching with an etchant for aluminum.

5. The method of claim 1 wherein said silicon layer has a thickness greater than 200 Angs., and a resist layer is formed over said silicon layer and subsequently exposed and developed to the configuration of desired interconnection pattern removing the exposed portions of the silicon with an etchant for silicon, and removing the resultant exposed portions of the aluminum layer with an etchant for aluminum.

6. The method of claim 1 wherein said selected portions of said silicon and aluminum layers are removed by lift-off techniques.

7. The method of claim 6 which further includes forming a layer of resist over said insulating surface layer on the monocrystalline semiconductor body prior to depositing the blanket layers of aluminum and silicon, exposing and developing the resist layer to form the reverse pattern of the desired interconnection metallurgy system, removing selected portions of said silicon and aluminum layers which have been deposited over said layer of resist by contacting the body with a solvent for said resist layer thereby removing the remaining portions of said resist and the overlying portions of said silicon and aluminum layers.

8. The method of claim 1 wherein the aluminum metallurgy pattern is formed by anodizing said masked blanket aluminum layer.

* * * * *